United States Patent
Shi

(10) Patent No.: US 10,916,678 B2
(45) Date of Patent: Feb. 9, 2021

(54) METHOD OF SUBSTRATE LIFT-OFF FOR HIGH-EFFICIENCY GROUP III-V SOLAR CELL FOR REUSE

(71) Applicant: National Central University, Taoyuan (TW)

(72) Inventor: Jin-Wei Shi, Taoyuan (TW)

(73) Assignee: National Central University, Taoyuan (TW)

( * ) Notice: Subject to any disclaimer, the term of this patent is extended or adjusted under 35 U.S.C. 154(b) by 149 days.

(21) Appl. No.: 16/385,115

(22) Filed: Apr. 16, 2019

(65) Prior Publication Data
US 2020/0335656 A1   Oct. 22, 2020

(51) Int. Cl.
*H01L 31/18* (2006.01)
*H01L 31/0687* (2012.01)

(52) U.S. Cl.
CPC .... *H01L 31/1852* (2013.01); *H01L 31/06875* (2013.01)

(58) Field of Classification Search
CPC ........... H01L 31/1852; H01L 31/06875; H01L 31/1804; H01L 2224/45124; H01L 31/022425
USPC ........................................................ 438/93
See application file for complete search history.

(56) References Cited

U.S. PATENT DOCUMENTS

| | | | | |
|---|---|---|---|---|
| 5,747,838 A | * | 5/1998 | Mishra | H01L 29/1033 257/192 |
| 2010/0186822 A1 | * | 7/2010 | Pan | H01L 31/02168 136/261 |
| 2011/0083729 A1 | * | 4/2011 | Lee | H01L 31/0687 136/255 |

FOREIGN PATENT DOCUMENTS

CN            206992133            * 9/2018

* cited by examiner

*Primary Examiner* — Duy T Nguyen
(74) *Attorney, Agent, or Firm* — Demian K. Jackson; Jackson IPG PLLC

(57) ABSTRACT

A method of is provided as a process of substrate lift-off. The present invention is mainly used for a group III-V solar cell, which has the highest power generation efficiency. An original sacrificial layer is changed into an AlAs oxide layer, which is transformed into an $AlO_x$ sacrificial layer after wet oxidation. The sacrificial layer is then soaked in an oxide-relief solution for etching. Thus, the lift-off process of a GaAs substrate can be harmlessly processed to the complex group III-V solar cell. The GaAs substrate can be recycled to be effectively further reused in photovoltaic devices with reduced cost.

5 Claims, 3 Drawing Sheets

METHOD OF SUBSTRATE LIFT-OFF FOR HIGH-EFFICIENCY GROUP III-V SOLAR CELL FOR REUSE

TECHNICAL FIELD OF THE INVENTION

The present invention relates to substrate lift-off; more particularly, to applying substrate lift-off to a group III-V solar cell having highest power generation efficiency, where a GaAs substrate of the group III-V solar cell can be harmlessly processed with a lift-off process to be recycled for reuse.

DESCRIPTION OF THE RELATED ARTS

With the popularity of wearable electronic applications in recent years, the development of flexible solar cell becomes very vigorous. In order to form a thin film on a flexible substrate, there are many inorganic and organic materials developed. The efficiencies of a variety of different solar cells have evolved over years, where multi-junction group III-V solar cell is still found to be the efficiency king in all related arts. However, such cell must be grown on a high-quality gallium arsenide (GaAs) or silicon substrate. In order to achieve softness, the lift-off technology for an epitaxial layer is developed. Such a high-efficiency soft cell lies its main market on solar panels of artificial satellites. Owing to the limited emission space in a rocket, such a large-size solar cell must be flexible and collapsible.

On the other hand, because of the rise of wearable electronic devices, this technology has now gradually involved into people's livelihood applications and combined with the flexible electronic devices. However, in the already-commercialized cell manufacturing process, the GaAs substrate is completely etched away, and this process is in fact basically contrary to the concept of green energy and environmental protection. This is because the arsenic compound is highly toxic. For environmental protection, most countries have gradually banned new GaAs substrate pulling up factories. A more environmentally friendly green energy choice can be found if the lift-off of the GaAs substrate of the epitaxial layer is continuously processed for recycle to grow new cell layer. There is a technology of GaAs substrate lift-off and re-bonding developed by German Fraunhofer Institute (F. Dimroth, M. Grave, P. Beutel, U. Fiedeler, C. Karcher, TND Tibbits, E. Oliva, G. Siefer then engaged, the M. Schachtner, A. Wekkeli, A W Bett, R. Krause, M. Piccin, N. Blanc, C. Drazek, E. Guiot, B. Ghyselen, T. Salvetat, A. Tauzin, T. Signamarcheix, A. Dobrich, T. Hannappel and K. Schwarzburg, Wafer bonded four-junction GaInP/GaAs// GaInAsP/GaInAs concentrator solar cells with 44.7% efficiency Progress in Photovoltaics: Research and Applications, 2014. 22 (3): p 277-282.) In this technology, a semiconductor layer is usually required to grow the sacrificial layer. During etching this layer, not only damage to the front surface of the epitaxial layer is forbidden, but hurt to the GaAs substrate is not allowed. If the substrate is injured, reuse of the substrate will be made very difficult. Hence, so far, most of the production grows indium gallium phosphide (InGaP) etching stop layer for protecting the front cell layer. Then, the entire GaAs substrate is etched away after thinning. Yet, few manufacturers grinds the GaAs substrate for reuse. Therefore, the companies of the GaAs epitaxial process use in-plant storage or a little portion of outsourcing recycling and curing treatment. No recycling mechanism is applied to metallic gallium. Hence, the prior arts do not fulfill all users' requests on actual use.

SUMMARY OF THE INVENTION

The main purpose of the present invention is to apply substrate lift-off to a group III-V solar cell having the highest power generation efficiency, where an original sacrificial layer is changed into an AlAs oxide layer, which is transformed into an $AlO_x$ sacrificial layer after wet oxidation; the sacrificial layer is then soaked in an oxide-relief solution for etching; thus, the lift-off process of a GaAs substrate can be harmlessly processed for the complex group III-V solar cell; and the GaAs substrate can be recycled to be effectively further reused in photovoltaic devices with reduced cost.

To achieve the above purposes, the present invention is a method of substrate lift-off for a high-efficiency group III-V solar cell, comprising steps of: (a) selecting a multi-junction solar cell structure, where the multi-junction solar cell structure has a group III-V solar cell; and an AlAs oxide layer and a substrate are sequentially formed on the group III-V solar cell; (b) processing a wet oxidation process, where the AlAs oxide layer in the multi-junction solar cell structure is transformed into an $AlO_x$ sacrificial layer; and (c) processing a lift-off process, where the multi-junction solar cell structure is soaked in an oxide-relief solution to process relief of the $AlO_x$ sacrificial layer to further remove the substrate of the multi-junction solar cell structure. Accordingly a novel method of substrate lift-off for a high-efficiency group III-V solar cell is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Figure 1:
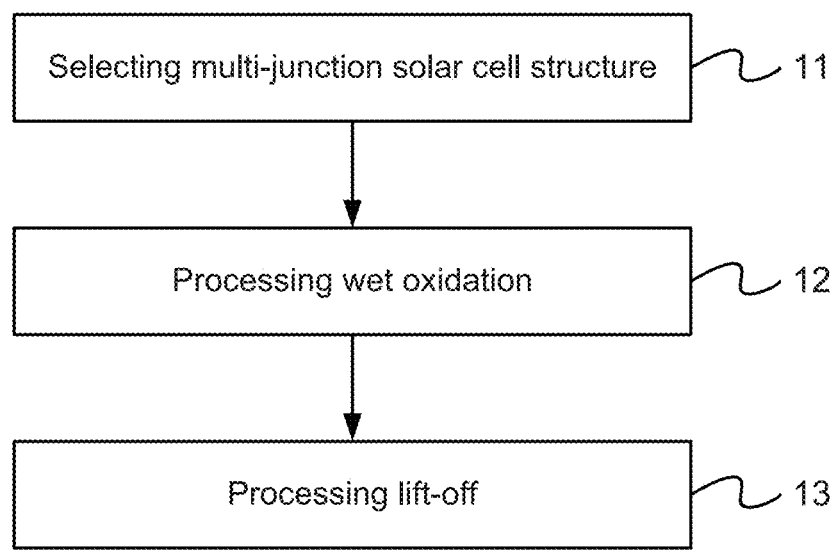
FIG. 1 is the flow view showing the preferred embodiment according to the present invention.
Figure 2:
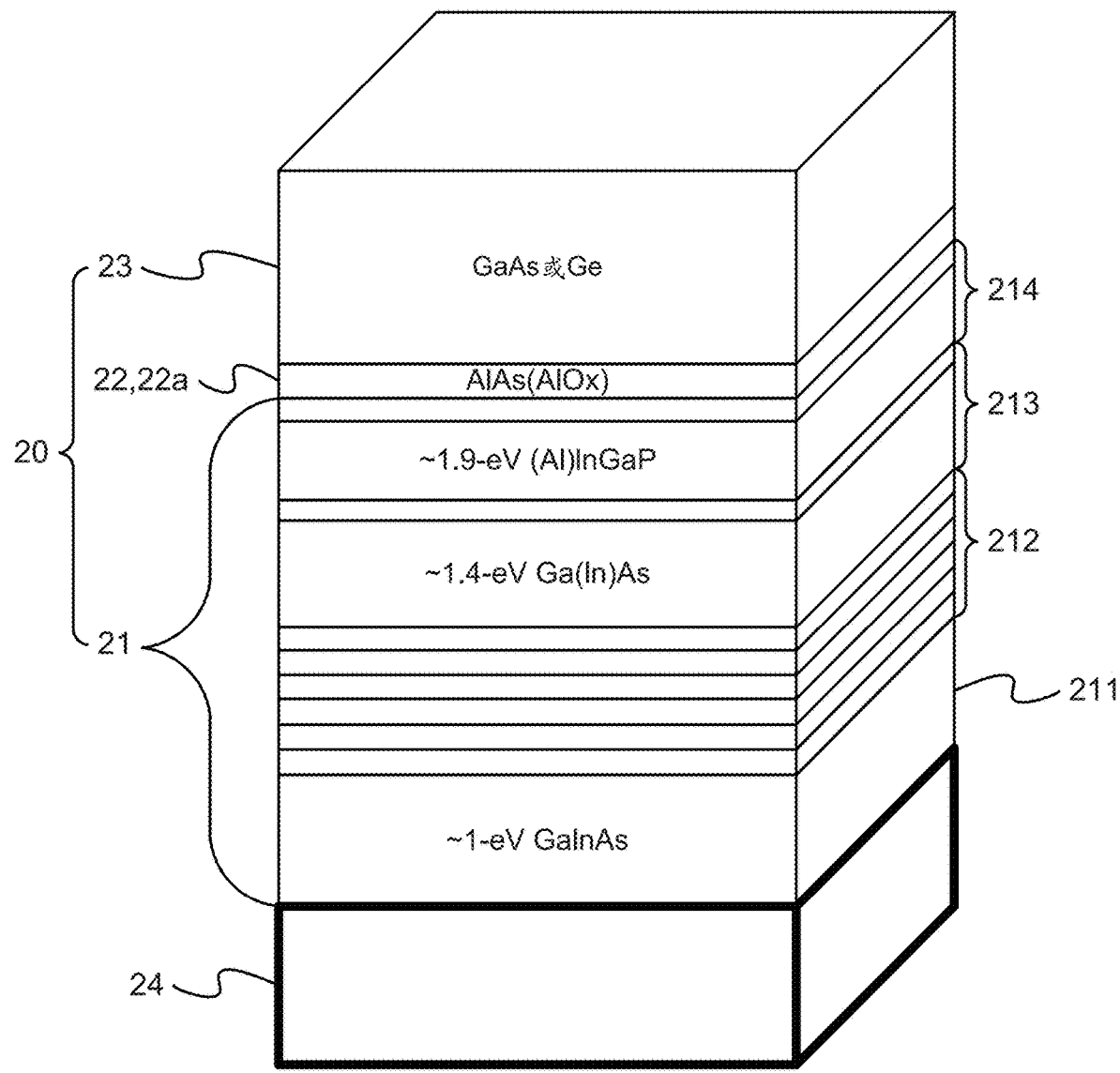
FIG. 2 is the view showing the flexible multi-junction solar cell structure.
Figure 3:
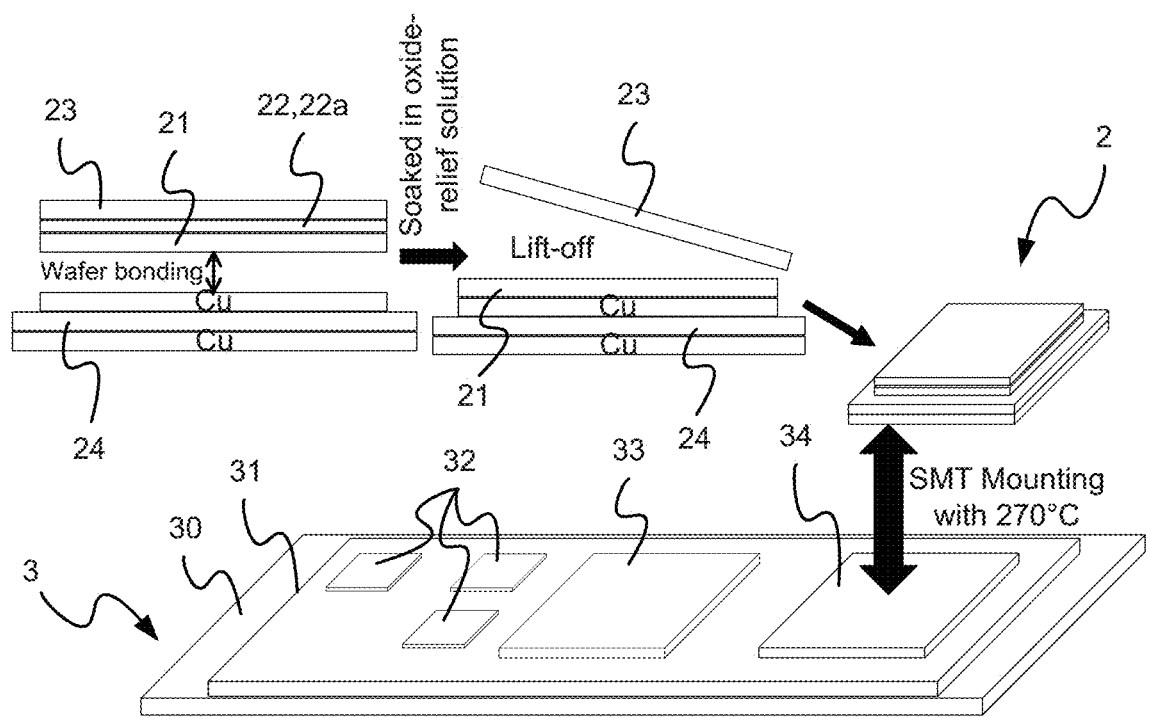
FIG. 3 is the view showing the mounting and integrating of the flexible multi-junction solar cell structure and the flexible smart dust chip.

Please refer to FIG. 1 to FIG. 3, which are a flow view showing a preferred embodiment according to the present invention; a view showing a flexible multi-junction solar cell structure; and a view showing mounting and integrating of the flexible multi-junction solar cell structure and a flexible smart dust chip. As shown in the figures, the present invention is a method of substrate lift-off for a high-efficiency group III-V solar cell, comprising the following steps:

(a) Selecting multi-junction solar cell structure 11: A multi-junction solar cell structure 20 is selected. The multi-junction solar cell structure 20 has a group III-V solar cell 21. An aluminum arsenic (AlAs) oxide layer 22 along with a gallium arsenide (GaAs) substrate 23 or a germanium (Ge) substrate is sequentially formed on the group III-V solar cell 21. The GaAs substrate 23 is taken for example.

(b) Processing wet oxidation 12: A wet oxidation process is processed. The AlAs oxide layer 22 in the multi-junction solar cell structure 20 is transformed into an aluminum oxide ($AlO_x$) sacrificial layer.

(c) Processing lift-off 13: A lift-off process is processed. The multi-junction solar cell structure 20 is soaked in an oxide-relief solution. The oxide-relief solution is a solution of buffer oxide etch (BOE) or hydrogen fluoride (HF) to process relief of the $AlO_x$ sacrificial layer for further removing the substrate of the multi-junction solar cell structure 20.

Thus, a novel method of substrate lift-off for a high-efficiency group III-V solar cell is obtained.

In the present invention, the lift-off process of solar cell substrate uses a verified prior art of an alumina lift-off technology for achieving the ultimate goal of regrowth and reuse of the substrate.

The alumina lift-off technology was applied to a high-speed vertical cavity surface emitting laser (VCSEL) as an evidence for verifying efficacy. The present invention applies an oxide-relief technology to a 850-nanometer (nm) VCSEL for further enhancing speed, lowering power consumption, and increasing device reliability.

Regarding the speed, parasitic capacitance can be effectively reduced owing to the processing of the relief of oxide layer. As seen in the results of direct current (DC) light-current-voltage (DC L-I-V) features and electro-optic frequency responses, speed is accelerated and the DC features are not deteriorated after processing the relief of the oxide layer of the VCSEL. Thus, it is proved that the oxide-relief solution used in present invention etches the oxide layer only, which would not at all attack GaAs-based complex alloys. In this way, the present invention applies this oxide-relief technology in processing the lift-off process of the substrate of the group III-V solar cell.

As shown in FIG. 2, the group III-V solar cell 21 grown according to the present invention has a structure, from bottom to top, sequentially comprising a GaInAs layer 211, whose energy gap is ~1 eV; a graded-metamorphic buffer layer 212; a Ga(In)As layer 213, whose energy gap is ~1.4 eV; and a (Al)GaInAs layer 214, whose energy gap is ~1.9 eV. The biggest difference to a general group III-V solar cell lies in that this structure further adds the AlAs oxide layer 22, where, before the lift-off process, the wet oxidation has to be processed to transform the AlAs oxide layer 22 into the $AlO_x$ sacrificial layer 22a for the relief of oxide layer. Besides, a flexible ceramic substrate 24 or interposa can be further bonded under the group III-V solar cell 21. After removing the GaAs substrate 23, a flexible multi-junction solar cell structure 2 is formed with the multi-junction solar cell structure 20. The group III-V solar cell 21 can be a group III-V solar cell unit wafer comprising a plurality of group III-V solar cell units. The group III-V solar cell unit wafer is uniformly distributed with a plurality of trenches to form a checkerboard distribution of rectangular blocks on the group III-V solar cell unit wafer. After the group III-V solar cell unit wafer is bonded to the flexible ceramic substrate 24, the wafer is soaked in the oxide-relief solution to finish the lift-off process of the GaAs substrates 23 after bonding the small-size (2 cm*2 cm) group III-V solar cell 21 and the flexible ceramic substrate 24.

FIG. 3 shows mounting and integrating of the flexible multi-junction solar cell structure 2 and the flexible smart dust chip 3, where the flexible multi-junction solar cell structure 2 is integrated into the flexible smart dust chip 3. The flexible smart dust chip 3 comprises a plurality of sensors 32 distributed on a flexible ceramic PCB 31 above a copper (Cu) template 31; a WiFi & microcontroller units (MCU) 33; and a Cu pattern 34. The flexible multi-junction solar cell structure 2 is applied with a surface mount technology (SMT) to be bond with the Cu pattern 34 under 270 celsius degrees to finish integrated wiring on the flexible smart dust chip 3 of a small-size (0.2 cm*0.2 cm) group III-V solar cell 21 and the flexible ceramic substrate 24, which benefits the self-operation performance of the flexible smart dust chip 3 without extra energy added.

The present invention is mainly used for a group III-V solar cell, which has the highest power generation efficiency. An original sacrificial layer is changed into an AlAs oxide layer, which is transformed into an $AlO_x$ sacrificial layer after wet oxidation. Then, the sacrificial layer is soaked in an oxide-relief solution (i.e. BOE or HF) for etching. Thus, a lift-off process of a GaAs substrate can be harmlessly processed for the complex group III-V solar cell. The GaAs substrate can be recycled to be effectively further reused in photovoltaic devices with reduced cost.

To sum up, the present invention is a method of substrate lift-off for a high-efficiency group III-V solar cell, where the present invention is mainly used in a group III-V solar cell, which has the highest power generation efficiency; an original sacrificial layer is changed into an AlAs oxide layer, which is transformed into an $AlO_x$ sacrificial layer after wet oxidation; the sacrificial layer is then soaked in an oxide-relief solution (i.e. BOE or HF) for etching; thus, a lift-off process of a GaAs substrate can be harmlessly processed to the complex group III-V solar cell; and the GaAs substrate can be recycled to be effectively further reused in photovoltaic devices with reduced cost.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A method of substrate lift-off for a high-efficiency group III-V solar cell, comprising steps of:
   (a) selecting a multi-junction solar cell structure,
      wherein said multi-junction solar cell structure has a group III-V solar cell; and an AlAs oxide layer and a substrate are sequentially obtained on said group III-V solar cell;
   (b) processing a wet oxidation process,
      wherein said AlAs oxide layer in said multi-junction solar cell structure is transformed into an $AlO_x$ sacrificial layer; and
   (c) processing a lift-off process,
      wherein said multi-junction solar cell structure is soaked in an oxide-relief solution to process relief of said $AlO_x$ sacrificial layer to further remove said substrate of said multi-junction solar cell structure.

2. The method according to claim 1,
   wherein said substrate is selected from a group consisting of a GaAs substrate and a Ge substrate.

3. The method according to claim 1,
   wherein said oxide-relief solution is a solution of a compound selected from a group consisting of buffer oxide etch (BOE) and hydrogen fluoride (HF).

4. The method according to claim 1,
   wherein a flexible ceramic substrate is further bonded under said group III-V solar cell; after removing said substrate, a flexible multi-junction solar cell structure is obtained with said multi-junction solar cell structure; and said flexible multi-junction solar cell structure is further mounted and integrated with a flexible smart dust chip to finish integrated wiring on said flexible smart dust chip of said flexible multi-junction solar cell structure and said flexible ceramic substrate.

5. The method according to claim 4, wherein said group III-V solar cell is a group III-V solar cell unit wafer comprising a plurality of group III-V solar cell units; said group III-V solar cell unit wafer is uniformly distributed with a plurality of trenches to obtain a checkerboard distribution of rectangular blocks on said group III-V solar cell unit wafer.

* * * * *